United States Patent
Muraoka

(10) Patent No.: US 6,630,058 B2
(45) Date of Patent: Oct. 7, 2003

(54) METHOD AND APPARATUS FOR MANUFACTURING FILM WITH CONDUCTIVE SHEET, FOR TOUCH-PANEL, AND FILM MANUFACTURED THEREBY

(75) Inventor: Toru Muraoka, Tokyo (JP)

(73) Assignee: Fujitsu Takamisawa Component Limited, Tokyo (JP)

( * ) Notice: Subject to any disclaimer, the term of this patent is extended or adjusted under 35 U.S.C. 154(b) by 0 days.

(21) Appl. No.: 09/773,527

(22) Filed: Feb. 2, 2001

(65) Prior Publication Data

US 2001/0051275 A1 Dec. 13, 2001

(30) Foreign Application Priority Data

Feb. 3, 2000 (JP) .......................................... 2000-032687
Dec. 28, 2000 (JP) .......................................... 2000-402949

(51) Int. Cl.⁷ ........................... C23C 16/00; C23C 14/32
(52) U.S. Cl. ........................... 204/192.12; 204/192.26; 204/192.27; 204/192.28; 204/298.24; 118/718; 427/109; 427/126.3; 427/162; 427/171; 427/172

(58) Field of Search ...................... 204/192.12, 192.26, 204/192.27, 192.28, 298.24; 118/718; 427/109, 126.3, 162, 171, 172

(56) References Cited

U.S. PATENT DOCUMENTS 5,016,561 A * 5/1991 Tokai et al. ................. 118/718

FOREIGN PATENT DOCUMENTS

| JP | 59-191639 | 10/1984 |
|----|-----------|---------|
| JP | 10-69352  | 3/1998  |
| JP | 10-69355  | 3/1998  |

* cited by examiner

Primary Examiner—Rodney G. McDonald
(74) Attorney, Agent, or Firm—Staas & Halsey LLP

(57) ABSTRACT

A tensile force is applied to at least a surface of a film to which a conductive material is applied within an elastic limit by a tensile force applying means, the conductive material is applied to a first surface of the film by a coating means in a tensioned state, and thereafter the tensile force is released by a tensile force releasing means to form the film having a conductive sheet for a touch-panel. Preferably, the tensile force applying means is a barrel-shaped roller.

14 Claims, 7 Drawing Sheets

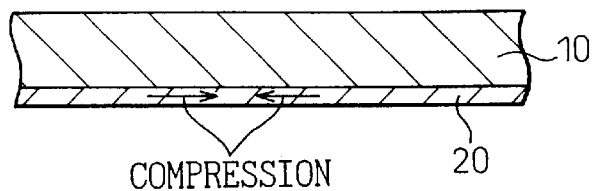
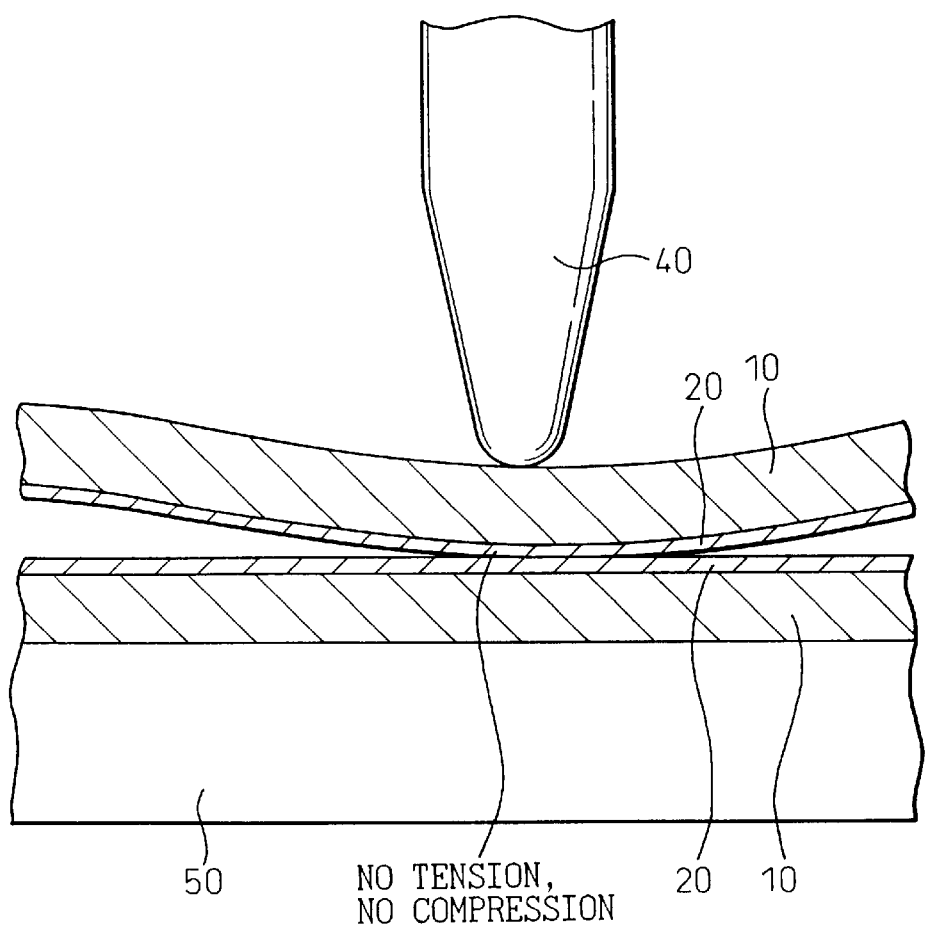

METHOD AND APPARATUS FOR MANUFACTURING FILM WITH CONDUCTIVE SHEET, FOR TOUCH-PANEL, AND FILM MANUFACTURED THEREBY

BACKGROUND OF THE INVENTION

1. Field of the Invention

The present invention relates to a method and apparatus for manufacturing a film with a conductive sheet, for a touch-panel, and a film manufactured thereby.

2. Description of the Related Art

A touch-panel has been used for various devices, by which an operator or a user can input, to the device, signals related to information shown in a display to which the touch-panel is attached. FIG. 7 is a view of a general structure of a touch-panel. In the touch-panel, films with transparent conductive sheets, each being composed of a transparent film 10 of elastic resin and a conductive sheet 20 laminated on the surface of the film 10, are spaced at a small distance via dot spacers 30 so that the conductive sheets 20 are opposed to each other, and are disposed on a glass plate 50. The touch-panel is pressed from the side opposite to the glass plate 50 by a user's finger or a pen point 40 so that an electrical connection is established at the depressed portion to input information.

FIG. 8 shows an apparatus for manufacturing a film with a transparent conductive sheet, used for the touch-panel. When the film 10, delivered from a delivery roller 100, runs on an intermediate roller 200a, a conductive material is placed on the surface of the film 10 located opposite the roller 200a by sputtering. Then, the film 10 is wound up by a winding roller 300. A cylindrical roller having a uniform diameter is used as the intermediate roller 200a.

In the touch-panel, a film with a conductive sheet manufactured by applying a conductive material onto the film 10 which is not tensioned, by means of the manufacturing apparatus as mentioned above, is used. Therefore, the conductive sheet 20 is tensioned when it is pressed by a finger or a pen point (see arrows in FIG. 7). Consequently, problems arise in which the conductive sheet 20 cracks or is separated due to repetitive depressions, thus resulting in a malfunction of the touch panel.

SUMMARY OF THE INVENTION

In view of the above problems, the object of the present invention is to provide a manufacturing method for easily manufacturing a highly durable film with a conductive sheet which can be used for a touch-panel that works properly for a long time without an occurrence of cracking or separation of the conductive sheet even by repetitive pressing. Another object of the present invention is to provide a manufacturing apparatus for the same and to provide a film manufactured thereby.

According to the present invention, there is provided a method for manufacturing a film having a conductive sheet for a touch-panel, comprising the steps of applying a tensile force to at least a first surface of the film to which a conductive material is to be applied, within its elastic limit; coating the conductive material onto the first surface of the film in a tensioned state; and releasing the tensile force after adhesion of the conductive material.

Preferably, the film is in the form of an elongated strip, and the method comprises the steps of continuously delivering the film and of continuously winding the film to which the conductive material has been applied, wherein, in the tensile force applying step, between the delivering step and the winding step, a second surface, opposite to the first surface to which the conductive material of the film is to be applied, runs on a surface of a barrel-shaped roller whose diameter at a center portion is larger than respective diameters of the end portions while tensioning the film in the travel direction.

Furthermore, according to the present invention, there is provided an apparatus for manufacturing a film having a conductive sheet for a touch-panel, comprising a means for applying a tensile force to at least a first surface of the film to which a conductive material is applied within an elastic limit; a means for coating the first surface of the film in a tensioned state, with the conductive material; and a means for releasing the tensile force.

Preferably, the film is in the form of an elongated strip, and the apparatus comprises a means for continuously delivering the film and a means for continuously winding the film to which the conductive material has been applied, said means for applying a tensile force being composed of a barrel-shaped roller whose diameter at a center portion is larger than respective diameters of the end portions, between the delivering means and the winding means, and a film pulling means for pulling the film in a travel direction so that a second surface opposite to the first surface to which the conductive material of the film is to be applied runs on the surface of the barrel-shaped roller.

Furthermore, according to the present invention, there is provided a film having a conductive sheet for a touch-panel, wherein a conductive material is applied to a first surface as a tensile force is applied to at least the first surface of the film to which the conductive material is to be applied within an elastic limit, and the tensile force is released after the application of the conductive material.

Preferably, while the film, in the form of an elongated strip, is continuously delivered from a delivery roller is tensioned in the travel direction, the film travels on a surface of a barrel-shaped roller whose diameter at a center portion is larger than respective diameters of the end portions, and thereafter the film is wound by a winding roller.

The present invention may be more fully understood from the description of preferred embodiments of the invention set forth below, together with the accompanying drawings:

BRIEF DESCRIPTION OF THE DRAWINGS

In the drawings:

FIG. 5 is a view of a film having a conductive sheet manufactured by an apparatus shown in FIG. 1, upon attaching it to a touch-panel;

FIG. 6 is a view of a film having a conductive sheet for a touch-panel, manufactured by an apparatus shown in FIG. 1, which is attached to a touch-panel and is pressed;

DESCRIPTION OF THE PREFERRED EMBODIMENTS

Embodiments of the present invention will be described below with reference to the accompanying drawings.

Figure 1:
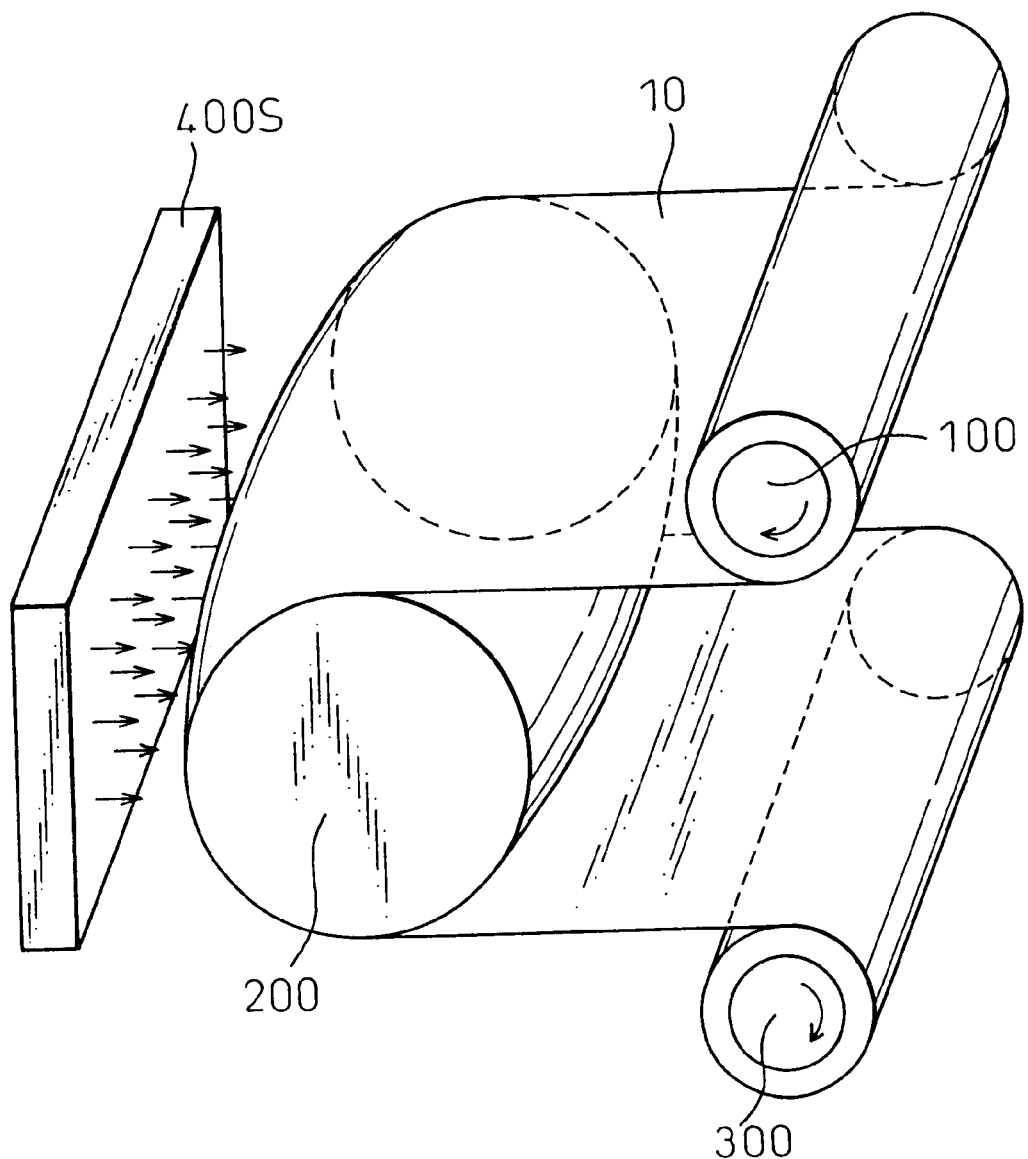
FIG. 1 is a schematic perspective view of an apparatus for manufacturing a film having a conductive sheet for a touch-panel, according to the present invention.

FIG. 1 schematically shows a perspective view of an apparatus for manufacturing a film, having a conductive sheet, for a touch-panel according to the present invention.

Figure 8:
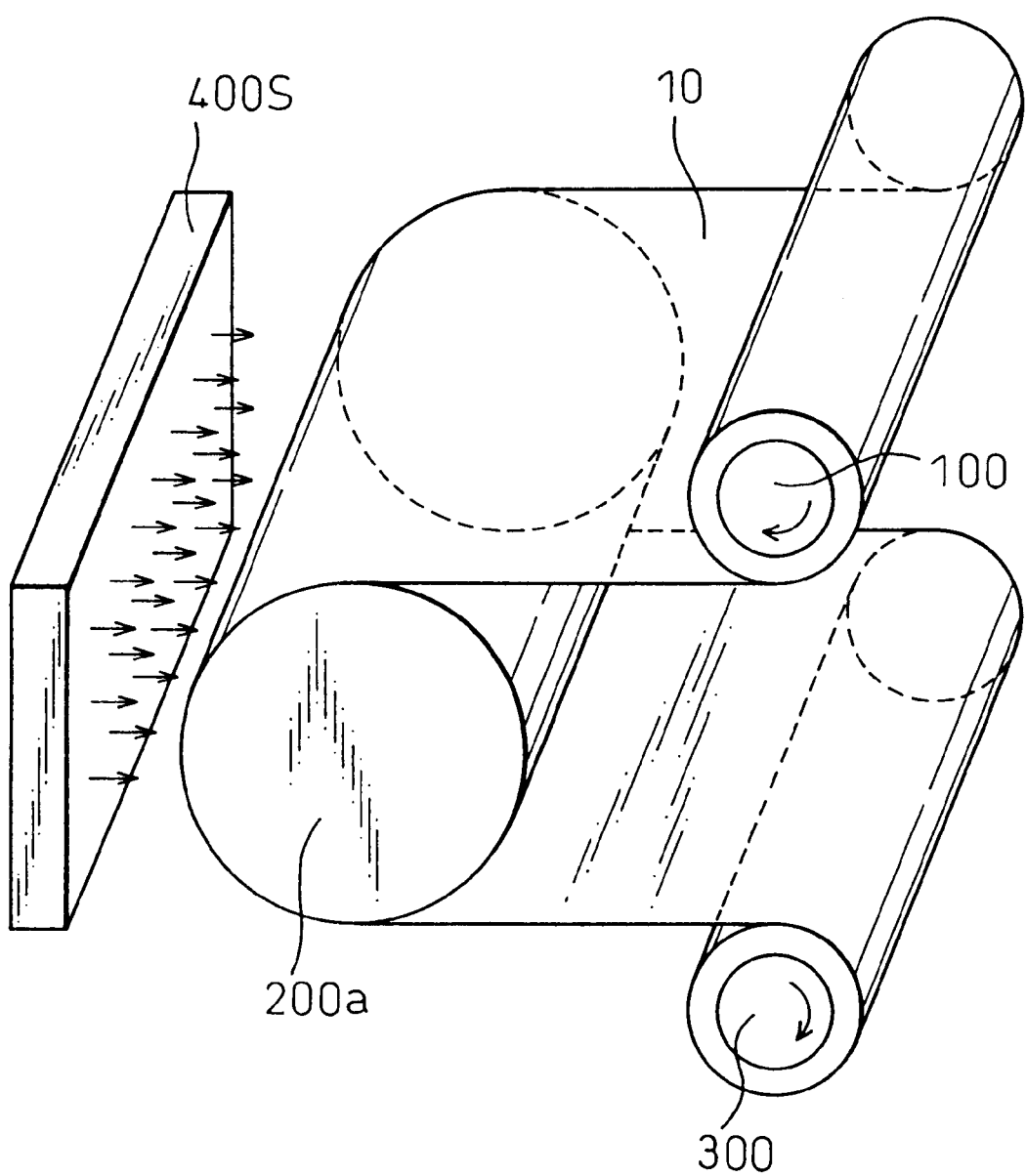
FIG. 8 is a schematic perspective view of a known apparatus for manufacturing a film having a conductive sheet for a touch-panel.

Using a method similar to a known manufacturing apparatus shown in FIG. 8, a transparent film 10 is wound on a delivery roller 100 which is rotated in a direction of an arrow shown in the drawing of FIG. 1 to deliver the film 10. The film 10 is made of a transparent elastic resin such as, for example, polyethylene terephthalate, polyether sulfone, polyether ether ketone, polycarbonate, polypropylene or polyimide.

The film 10, delivered from the delivery roller 100, runs along the surface of a barrel-shaped intermediate roller 200 whose diameter at the center portion is larger than respective diameters of the end portions, and is wound by a winding roller 300 thereafter. When the film 10 runs on the surface of the barrel-shaped intermediate roller 200, a conductive material S from a target 400S of a sputtering apparatus 400 (see FIG. 2) is placed onto the surface of the film 10, by sputtering by the sputtering apparatus 400, to form a conductive sheet 20 laminated thereon.

Note that a transparent conductive material including ITO(indium tin oxide), FTO(fluorine tin oxide), ATO (antimony tin oxide), aluminum-doped zinc oxide, indium-doped zinc oxide or the like is used as the sputtered conductive material S.

When the film 10 runs along the surface of the barrel-shaped intermediate roller 5, the film 10 is tensioned in the travel direction. Accordingly, the film 10 is tensioned not only in the travel direction but also in multiple directions when the film 10 runs along the surface of the barrel-shaped intermediate roller 5. For example, the rotational speed VR1 of the delivery roller 100 is set to be smaller than the rotational speed VR2 of the winding roller 300 to tension the film 10 in the travel direction. Alternatively, it is possible to provide an idler roller or rollers (not shown) between the barrel-shaped intermediate roller 200 and the delivery roller 100 and/or the winding roller 3.

Figure 2:
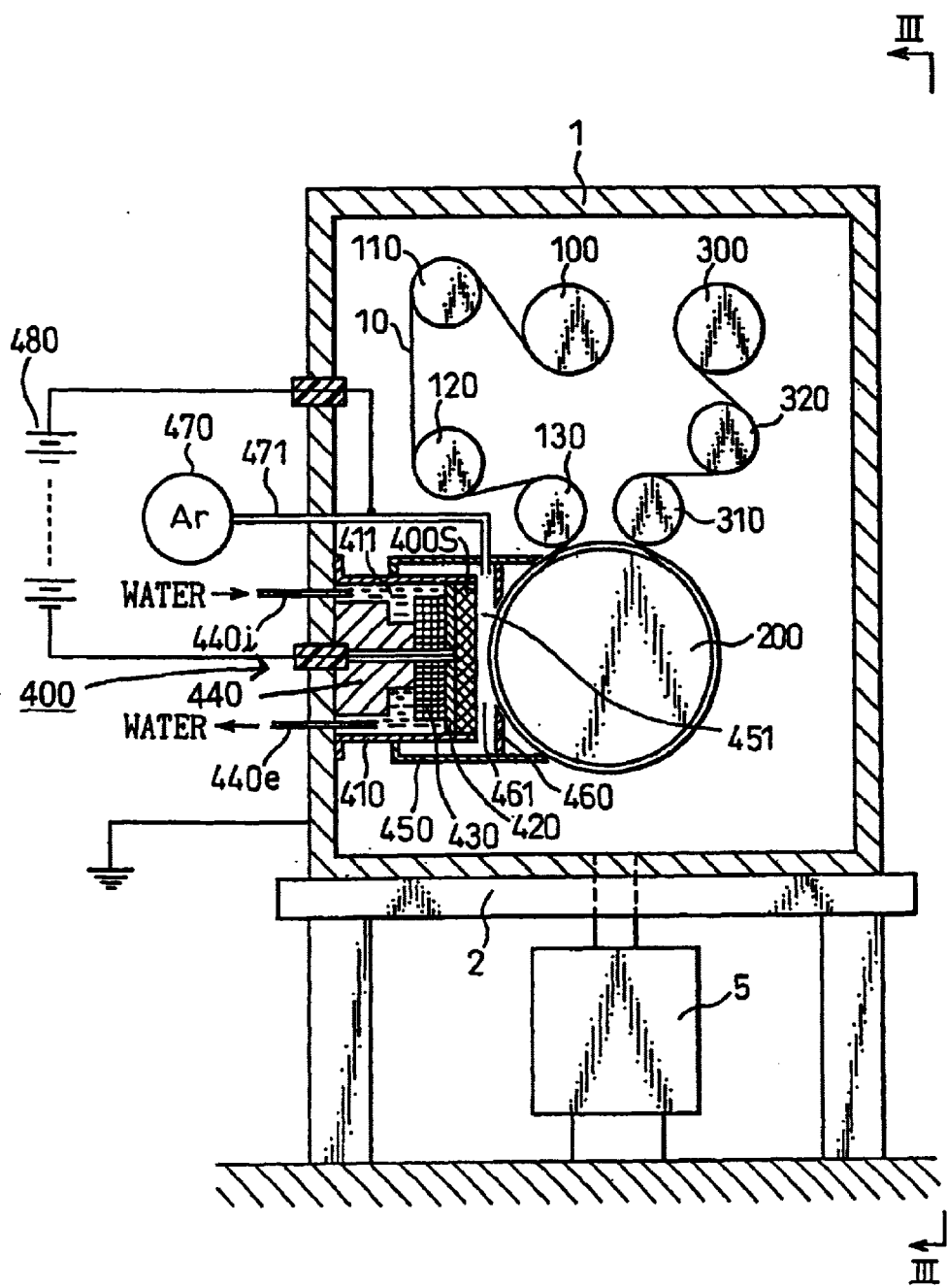
FIG. 2 is a side view of an actual manufacturing apparatus.

FIG. 2 shows an actual manufacturing apparatus viewed from the direction of the roller axis.

As can be seen in FIG. 2, in the actual manufacturing apparatus, the delivery roller 100, the winding roller 300, the sputtering apparatus 400, the barrel-shaped intermediate roller 200, etc., are provided in the housing 1 the inside of which is evacuated by a vacuum pump 5 to a vacuum of approximately 0.08 to 0.13 Pa.

In order to stably feed the film from the delivery roller 100 to the intermediate roller 200, auxiliary rollers 110, 120 and 130 are provided. Furthermore, auxiliary rollers 310 and 320 are provided between the intermediate roller 200 and the winding roller 300 to stably feed the film from the intermediate roller 200 to the winding roller 300.

The barrel-shaped roller 200 is shaped so that, on the assumption that the radius thereof at the center portion in the width direction is r (FIG. 3), the radius at a portion spaced from the center by r in the width direction is in the range of 0.97r to 0.99r. Consequently, when the film 10 moves on the barrel-shaped roller 200, a tensile force is applied to the film 10 which is subject to a stress of $2 \times 10^5$ to $6 \times 10^5$ Pa (2.0 to 6.0 Kg/cm$^2$) in a section perpendicular to the tensile direction of the film 10.

The target 400S (hatched with oblique cross lines in the drawing of FIG. 2) of the sputtering apparatus 400 is mounted to the front end of a target support member 410 extending toward the center of the housing 1 and attached to the inner surface of the housing 1. A magnet 430 (hatched with vertical and horizontal cross lines) is provided on the rear side of the target 400S through a metal packing 420. The magnet 430 is supported by a magnet support member 440 which is attached at its outer side to the inner surface of the housing 1.

The cooling water supplied from a cooling water supply tube 440$i$ is introduced in a space 411 defined by the magnet 430 and the magnet support member 440 in the target support member 410 and is discharged through a cooling water discharge pipe 440$e$ to prevent the target 400S and the magnet 430 from being overheated.

A sputtering casing 450 is attached to the outside of the target support member 410. The front end of the sputtering casing 450 is located in close proximity to the film 10 which moves on the surface of the intermediate roller 200. A window member 460 having a window 461 to define the sputtering zone is provided in the sputtering casing 450.

Argon gas is fed in a space 451 defined by the sputtering casing 450, the window member 460, the target 400S, the target support member 410, and the film 10, from an argon gas cylinder 470 outside the housing 1, through an argon gas supply pipe 471.

The argon gas supply pipe 471 is connected to the high voltage side of the power source 480 located outside the housing 1 which is grounded. The target 400S is connected to the low voltage side of the power source 480.

Each atom of the argon gas is separated into Ar$^+$ and e$^-$ due to the high voltage applied to the argon gas supply pipe 471 and the magnetic force of the magnet 430 in the space 451. Consequently, Ar$^+$ impinges upon the target 400S, so that atoms of the conductive material S are emitted from the surface of the target 400S. The emitted atoms of the target material pass through the window 461 of the window member 460 and are accumulated on the surface of the film 10.

Figure 3:
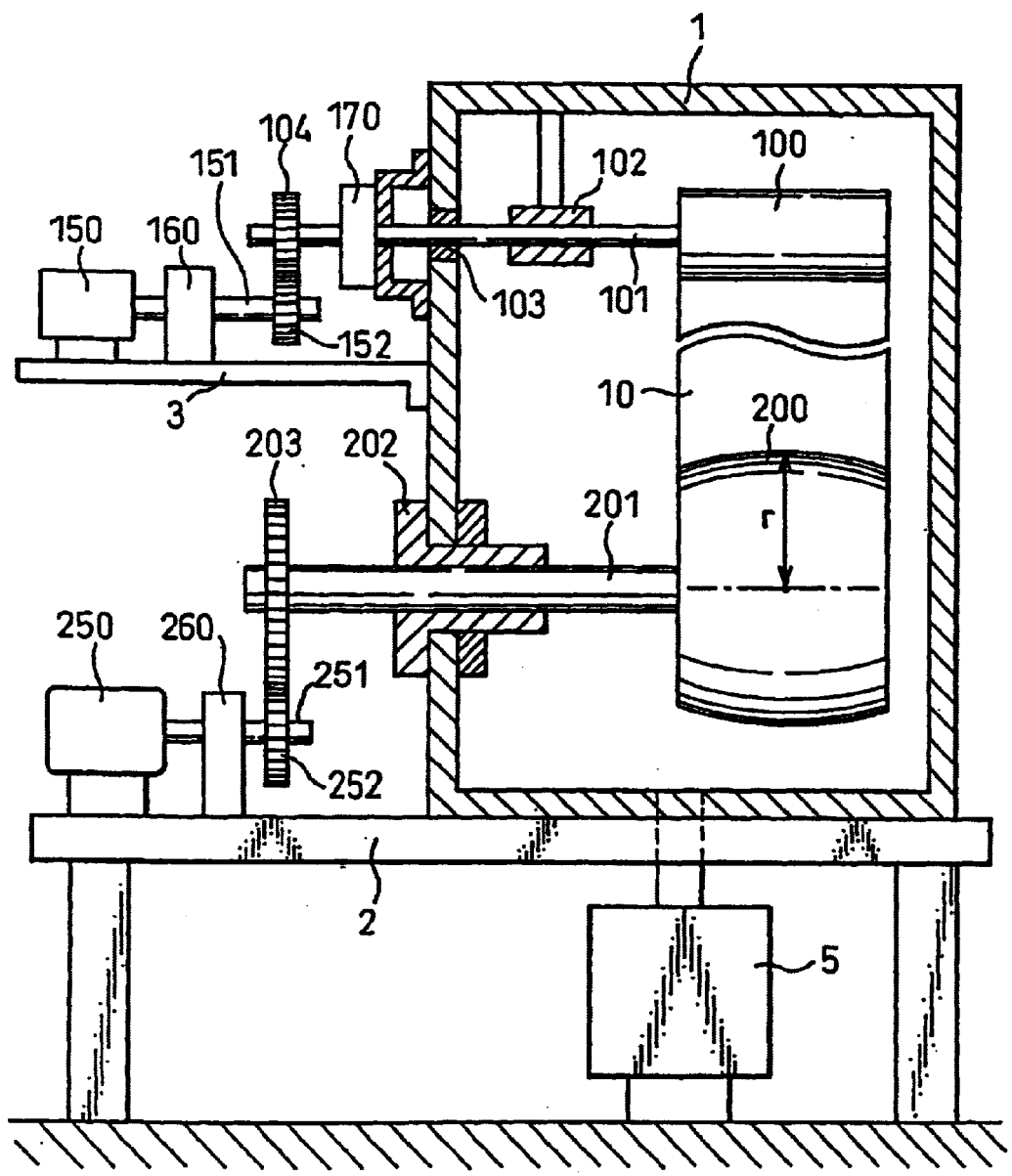
FIG. 3 is a sectional view taken along the line III—III in FIG. 2.

The supporting and driving method of the rollers, etc., will be discussed below with reference to FIG. 3.

The shaft 101 of the delivery roller 100 extends through a support 102 attached to the top wall of the housing 1 and through a seal member 103 attached to the side wall of the housing, and extends to the outside of the housing 1. A brake member 170 held by the housing 1 is attached to the shaft 101 extending outward from the housing 1. The shaft 101 is provided on its front end with a gear 104 secured thereto. The gear 104 is in mesh with a gear 152 which is secured to a shaft 151 of a motor 150 provided on a support 3 attached to the housing 1 and extending through a torque controller 160. Thus, the delivery roller 100 is driven by the motor 150.

The winding roller 300 is driven in the same way as the delivery roller.

A shaft 201 of the intermediate roller 200 extends outward from the housing 1 through a supporting seal member 202 attached to the side wall of the housing 1 and is provided on the front end thereof with a gear 203. The gear 203 is in mesh with a gear 252 which is secured to a shaft 251 of a motor 250 provided on a base frame 2. The shaft 251 extends through a clutch 260. Thus, the intermediate roller 200 is driven by the motor 250.

The auxiliary rollers 110, 120, 130 and 310, 320 are not driven and their shafts (not shown for clarity) are supported within the housing without extending outward therefrom.

Figure 4:
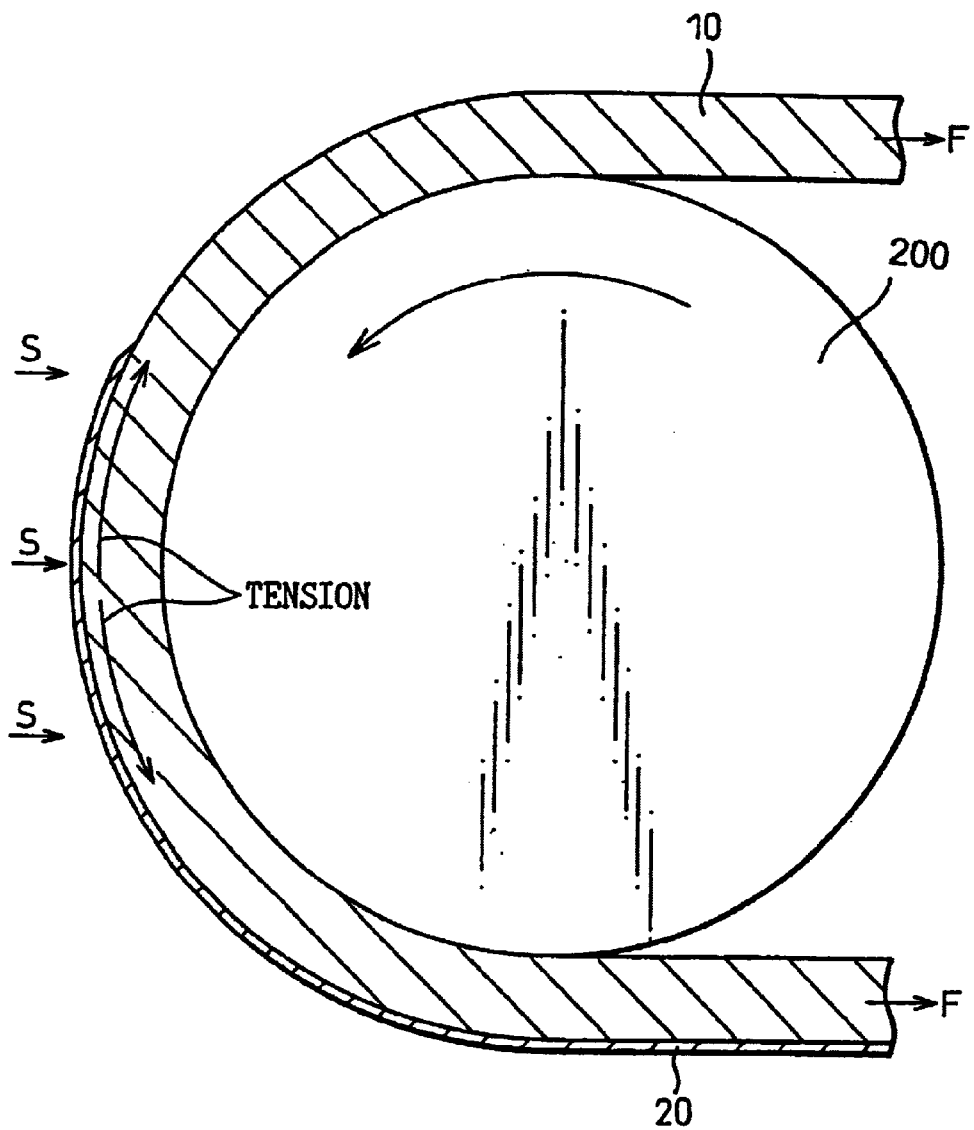
FIG. 4 is a view explaining the coating of a conductive material by means of an apparatus shown in FIG. 1.
Figure 7:
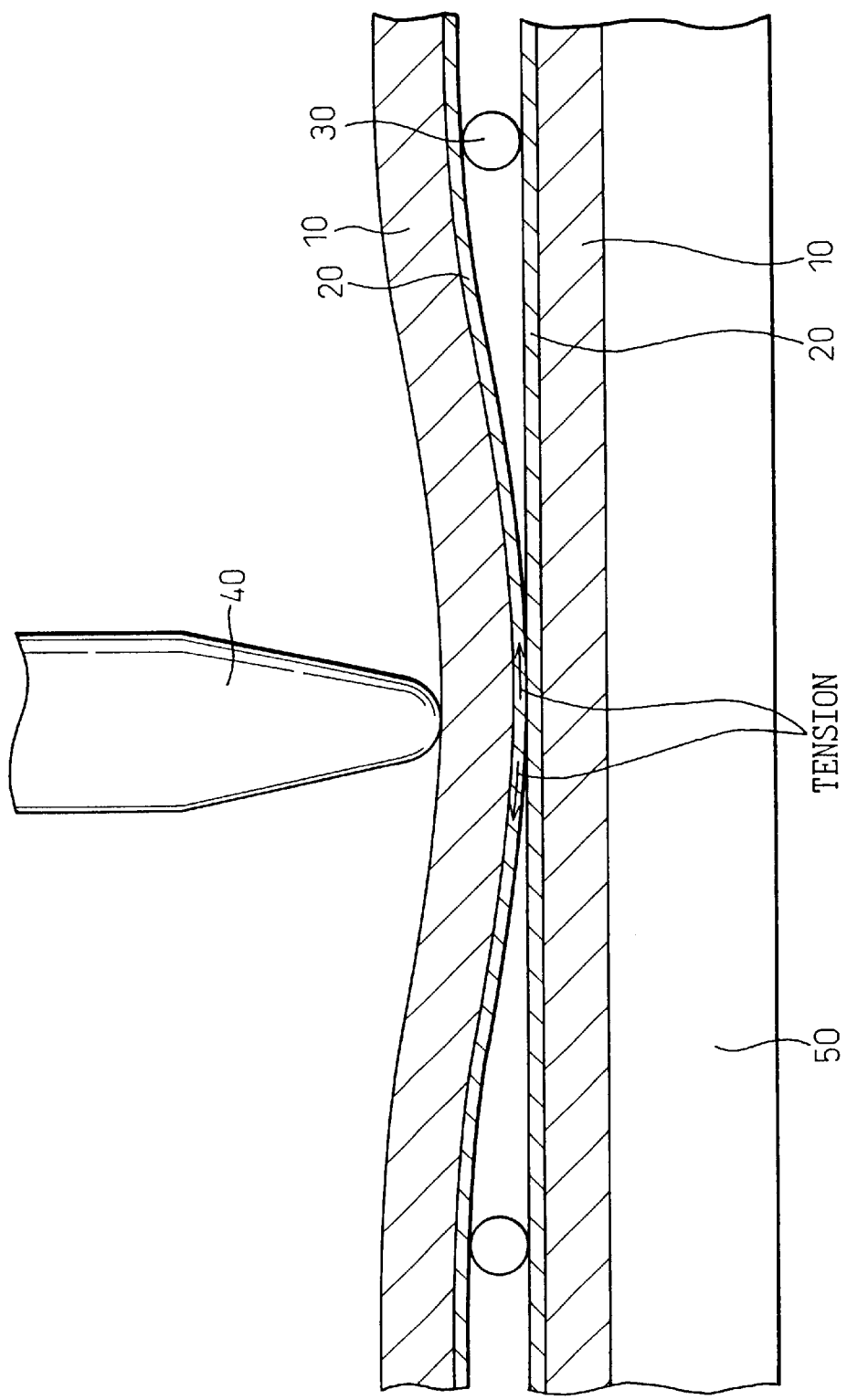
FIG. 7 is a view of a general structure of a touch-panel.

FIG. 4 is a sectional view taken along a plane parallel to the travel direction which shows the film 10 running along the barrel-shaped intermediate roller 200, onto which the conductive material S is placed. The surface of the film 10 onto which the conductive material S is evaporated is tensioned in all directions.

A transparent conductive material such as ITO(indium tin oxide), FTO(fluorine tin oxide), ATO(antimony tin oxide), aluminum-doped zinc oxide, indium-doped zinc oxide or the like is used as the sputtered conductive material S.

FIG. 5 shows the film 10 having the conductive sheet which is wound on the winding roller 300, and is thereafter drawn from the winding roller 300 and is cut, before being attached to the touch-panel. In this state, the conductive sheet 20 is compressed (see arows in FIG. 5).

FIG. 6 shows the film 10 having the conductive sheet 20 which is attached to the touch-panel and is pressed by a pen point 40. When the conductive sheet 20 is pressed as such, the compression in the conductive sheet 20 is released but the sheet 20 is not tensioned.

The conductive sheet of the film with the conductive sheet for a touch-panel manufactured as described above is normally compressed. When the conductive sheet is pressed by a finger of a user or a pen point, the compression in the conductive sheet 20 is released, but the sheet is not tensioned. Thus, no cracking or separation of the sheet tends to occur. This results in a high durability in use.

As described above, according to the present invention, the highly durable film with the conductive sheet for a touch-panel with can be easily manufactured. As can be seen from a comparison between FIG. 1 and FIG. 6, a modification of a part of a known apparatus is all that is needed to obtain an apparatus for manufacturing the above film.

The present invention can be applied to, for example, adhesion of a transparent sheet of $TiO_2$(titanium dioxide), $SiO_2$ (silicon dioxide) or the like as an undercoat member of the film having a transparent conductive sheet for a touch-panel.

According to the present invention, since the conductive material is applied on the film in a tensioned state by a tensile applying means, preferably by a barrel-shaped roller, the highly durable film with the conductive sheet for a touch-panel can be easily manufactured without using a die.

What is claimed is:

1. A method for manufacturing a film, in a form of an elongated strip and with a conductive sheet adhered thereon, for a touch-panel, comprising:

continuously delivering the elongated strip of film from a supply thereof and continuously moving same through a coating area such that a continuously changing portion of the strip of film is within the coating area;

applying a tensile force to the film so as to produce a tensioned state of the film simultaneously in plural directions within the film and within an elastic limit of the film, in at least the continuously changing portion within the coating area;

coating the conductive material onto a first surface of the film on the continuously changing portion thereof within the coating area and while the film is in the tensioned state, to form a conductive sheet adhered thereon; and releasing the tensile force after adhesion of the conductive sheet to the film, thereby placing the conductive sheet under compression, when released from the tensile force and in a flat state of the film.

2. A method according to claim 1, wherein: the method further comprises:

continuously winding the film on which the conductive sheet is adhered, and the tensile force is applied, between the continuously delivering and winding of the film, to a second surface of the film, opposite to the first surface to which the conductive material of the film is to be applied, while the second surface of the film is running on a surface of a barrel-shaped roller having a diameter at a center portion thereof which is larger than respective diameters of end portions thereof and while tensioning the film in the travel direction.

3. A method according to claim 2, wherein the coating comprises sputtering the conductive material.

4. A method according to claim 2, wherein the winding comprises winding the film onto a cylindrical roller having a uniform diameter to remove the tensile force.

5. A manufacturing method according to claim 2, wherein the barrel-shaped roller is formed so that the radius at a portion spaced from the center thereof by r in the width direction is in the range of 0.97r to 0.99r, wherein r represents the radius of the center portion of the roller in the width direction.

6. A manufacturing method according to claim 1, wherein the tensile force is such that a section, in a direction normal to the tensile direction, is subject to a stress of $2\times10^5$ to $6\times10^5$ Pa.

7. A manufacturing method according to claim 1, wherein the film comprises a single layer film or a multi-layered film made of one or more films selected from a polyethyleneterephthalate film, a polyethersulfone film, a polyetheretherketone film, a polycarbonate film, a polypropylene film and a polyimide film.

8. A method for manufacturing a film having a conductive sheet laminated thereon, for a touch panel, comprising:

applying a tensile force to the film so as to produce a tensioned state of the film simultaneously in plural directions within the film, within an elastic limit of the film and at least within an area of the film to which a conductive material is to be applied;

coating the conductive material onto a first surface of the film in the tensioned state thereof produced by the applied tensile force; and releasing the tensile force after adhesion of the conductive material to the first surface of the film and thereby placing the laminated conductive sheet under compression in a flat state of the film.

9. A method according to claim 8, wherein: the method further comprises:

continuously winding the film on which the conductive sheet is adhered, and the tensile force is applied, between the continuously delivering and winding of the film, to a second surface of the film, opposite to the first surface to which the conductive material of the film is to be applied, while the second surface of the film is running on a surface of a barrel-shaped roller having a diameter at a center portion thereof which is larger than respective diameters of end portions thereof and while tensioning the film in the travel direction.

10. A method according to claim 9, wherein the coating comprises sputtering the conductive material.

11. A method according to claim 9, wherein the winding comprises winding the film onto a cylindrical roller having a uniform diameter to remove the tensile force.

12. A manufacturing method according to claim 9, wherein the barrel-shaped roller is formed so that the radius at a portion spaced from the center thereof by r in the width direction is in the range of 0.97r to 0.99r, wherein r represents the radius of the center portion of the roller in the width direction.

13. A manufacturing method according to claim 8, wherein the tensile force is such that a section, in a direction normal to the tensile direction, is subject to a stress of $2 \times 10^5$ to $6 \times 10^5$ Pa.

14. A manufacturing method according to claim 8, wherein the film comprises a single layer film or a multi-layered film made of one or more films selected from a polyethyleneterephthalate film, a polyethersulfone film, a polyetheretherketone film, a polycarbonate film, a polypropylene film and a polyimide film.

* * * * *